United States Patent
Birei et al.

(10) Patent No.: US 10,812,096 B2
(45) Date of Patent: Oct. 20, 2020

(54) AD CONVERTING DEVICE AND ELECTRONIC APPARATUS

(71) Applicant: Icom Incorporated, Osaka (JP)

(72) Inventors: Tadamune Birei, Osaka (JP); Yuta Morishita, Osaka (JP)

(73) Assignee: Icom Incorporated, Osaka (JP)

( * ) Notice: Subject to any disclaimer, the term of this patent is extended or adjusted under 35 U.S.C. 154(b) by 0 days.

(21) Appl. No.: 16/668,518

(22) Filed: Oct. 30, 2019

(65) Prior Publication Data

US 2020/0136636 A1   Apr. 30, 2020

(30) Foreign Application Priority Data

Oct. 31, 2018  (JP) ................................. 2018-206063

(51) Int. Cl.
*H03M 1/48*  (2006.01)
*H03M 1/12*  (2006.01)
*H03M 1/06*  (2006.01)

(52) U.S. Cl.
CPC ....... *H03M 1/1245* (2013.01); *H03M 1/0626* (2013.01)

(58) Field of Classification Search
CPC ............. H03M 1/1245; H03M 1/0626; H03M 1/1023; H03M 1/203; H03M 1/207; H03M 1/12
USPC ................................................. 341/115, 155
See application file for complete search history.

(56) References Cited

U.S. PATENT DOCUMENTS

| | | | | |
|---|---|---|---|---|
| 7,692,570 B2 * | 4/2010 | Martellock | ......... | H03M 1/1215 341/155 |
| 7,777,659 B2 * | 8/2010 | Nara | ...................... | G01R 23/16 341/143 |
| 8,175,199 B2 * | 5/2012 | Nakatani | ................. | H03L 7/099 331/4 |
| 8,244,202 B2 * | 8/2012 | Kitayabu | ............. | H04B 1/0064 375/339 |
| 8,953,715 B1 * | 2/2015 | Haddadin | ............ | H04B 1/0067 375/316 |
| 9,014,312 B1 * | 4/2015 | Haddadin | ........... | H04L 27/2647 375/346 |
| 2006/0165198 A1 * | 7/2006 | Tietjen | ................ | H04L 27/3845 375/331 |
| 2009/0027250 A1 * | 1/2009 | Nara | ...................... | G01R 23/16 341/155 |

(Continued)

FOREIGN PATENT DOCUMENTS

JP   08-162990 A   6/1996
JP   4789631 B   10/2011

*Primary Examiner* — Jean B Jeanglaude
(74) *Attorney, Agent, or Firm* — Mintz Levin Cohn Ferris Glovsky and Popeo, P.C.; David G. Conlin; Steven M. Jensen

(57) ABSTRACT

A wireless communication device converts a signal component, which has one of distributed frequency bands in an analog RF signal and passes through one of a plurality of bandpass filters, into digital data with an AD converter that carries out undersampling. A sampling frequency of the AD converter is set so that frequencies which are integral multiples of a Nyquist frequency based on the sampling frequency do not fall within frequency bands of signal components which are of the RF signal and are to pass through the respective plurality of bandpass filters.

5 Claims, 4 Drawing Sheets

(56) References Cited

U.S. PATENT DOCUMENTS

2009/0310712 A1* 12/2009 Nakatani ................. H03J 1/005
375/316
2009/0325520 A1* 12/2009 Kitayabu ............. H04B 1/0064
455/142

* cited by examiner

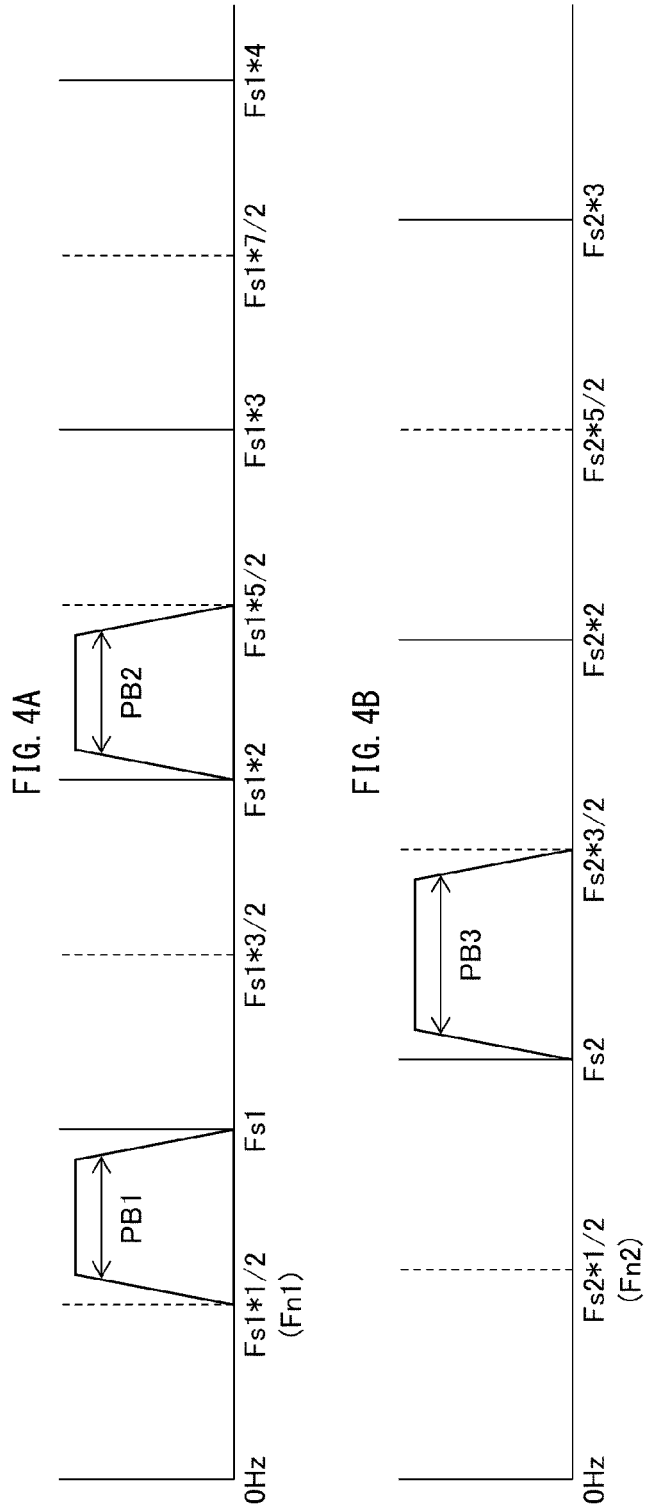

AD CONVERTING DEVICE AND ELECTRONIC APPARATUS

This Nonprovisional application claims priority under 35 U.S.C. § 119 on Patent Application No. 2018-206063 filed in Japan on Oct. 31, 2018, the entire contents of which is hereby incorporated by reference.

TECHNICAL FIELD

The present invention relates to an AD converting device that carries out undersampling.

BACKGROUND ART

In a case where a frequency component which is higher than a Nyquist frequency that is ½ of a sampling frequency is sampled in converting an analog signal into a digital signal with an AD converter, a phenomenon called "aliasing" occurs in which signals having different frequencies cannot be distinguished from each other. Therefore, for digitizing a high frequency signal, it is necessary to use an AD converter of high sampling rate and a lowpass filter for removing a signal component having a frequency which is not lower than the Nyquist frequency.

The AD converter of high sampling rate is generally expensive and consumes a large amount of power. In addition, a large amount of digital data is outputted from the AD converter of high sampling rate, and therefore a circuit (CPU, FPGA, DSP, or the like) that processes such digital data is demanded to have high performance for achieving a large amount of arithmetic processing.

On the contrary, there is a technique in which a signal is sampled with use of an AD converter of low sampling rate. According to this technique, undersampling is carried out in which an aliasing signal having a frequency of not lower than the Nyquist frequency is sampled at a sampling frequency, and therefore the AD converter of high sampling rate as described above is not used.

For example, Patent Literature 1 discloses a technique to sample a broadband input signal by dividing a frequency band of an input signal with use of a plurality of BPFs and sampling and synthesizing the divided bands with an AD converter. In addition, Patent Literature 1 discloses that undersampling is carried out with respect to a signal having a frequency band higher than the Nyquist frequency, among the divided signals.

Note, however, that there is a problem that a plurality of aliases cannot be distinguished when undersampling is carried out. To cope with such a problem, for example, Patent Literature 2 discloses that aliasing of a signal component other than a signal component having a frequency band to be sampled is prevented by carrying out bandpass filtering immediately before undersampling.

CITATION LIST

Patent Literature

Patent Literature 1: Japanese Patent No. 4789631 (Publication Date: Oct. 12, 2011)

Patent Literature 2: Japanese Patent Application Publication, Tokukaihei, No. 8-162990 (Publication Date: Jun. 21, 1996)

SUMMARY OF INVENTION

Technical Problem

According to the technique disclosed in Patent Literature 1, the number of plurality of AD converters to be used need to match with the number of divided bands, and this leads to an increase in cost of the AD converters. Moreover, according to the technique, digital signals which have been converted by the plurality of AD converters need to be synthesized, and therefore the circuit to process the digital data is demanded to have high performance. Furthermore, according to the technique disclosed in Patent Literature 2, a broadband signal cannot be sampled.

An object of an aspect of the present invention is to carry out sampling in AD conversion inexpensively and efficiently.

Solution to Problem

In order to attain the object, an AD converting device in accordance with an aspect of the present invention includes: a plurality of bandpass filters that respectively allow signal components of an analog input signal to pass through, the signal components having distributed frequency bands; an AD converter that converts a signal component which is one of the signal components and has been supplied through any one of the plurality of bandpass filters into digital data by undersampling; and a filter selecting section that selects, from among the plurality of bandpass filters, one bandpass filter to be connected to the AD converter, a sampling frequency of the AD converter being set so that frequencies which are integral multiples of a Nyquist frequency based on the sampling frequency do not fall within the frequency bands of the signal components which are of the analog input signal and are to pass through the respective plurality of bandpass filters.

Advantageous Effects of Invention

According to an aspect of the present invention, it is possible to carry out sampling in AD conversion efficiently.

BRIEF DESCRIPTION OF DRAWINGS

FIG. 4A is a view showing Nyquist zones of an AD converter of the wireless communication device illustrated in FIG. 3.

FIG. 4B is a view showing other Nyquist zones of an AD converter of the wireless communication device illustrated in FIG. 3.

DESCRIPTION OF EMBODIMENTS

Embodiment 1

Embodiment 1 of the present invention will be described with reference to FIG. 1 and FIG. 2.

Figure 1:
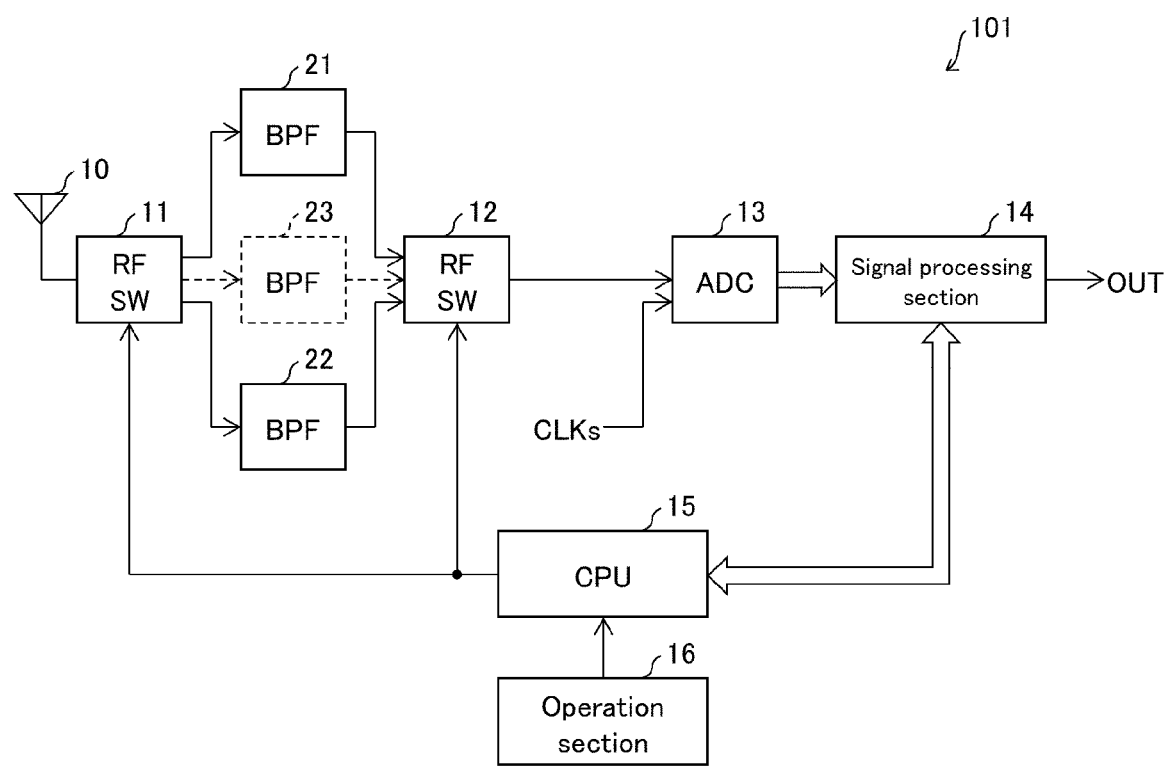
FIG. 1 is a block diagram illustrating a configuration of a wireless communication device in accordance with Embodiment 1 of the present invention.

FIG. 1 is a block diagram illustrating a configuration of a wireless communication device 101 in accordance with Embodiment 1. FIG. 2 is a view showing Nyquist zones of an AD converter 13 in the wireless communication device 101.

As illustrated in FIG. 1, the wireless communication device 101 (electronic apparatus) includes an antenna 10, high frequency switches (indicated by RFSW in FIGS. 1) 11 and 12, an AD converter (indicated by ADC in FIG. 1) 13, a signal processing section 14, a central processing unit (CPU) 15, and an operation section 16. The wireless communication device 101 also includes bandpass filters (indicated by BPF in FIGS. 1) 21 and 22.

In the following descriptions, the high frequency switches 11 and 12 are referred to as RFSWs 11 and 12, the AD converter 13 is referred to as ADC 13, and the bandpass filters 21 and 22 are referred to as BPFs 21 and 22.

The RFSW 11 is a switch that switches between the BPF 21 and the BPF 22 for connecting the selected one of the BPF 21 and the BPF 22 with the antenna 10 so that an RF signal (input signal), which has been received by the antenna 10, is supplied to the selected one of the BPF 21 and the BPF 22. The RFSW 12 is a switch that switches between the BPF 21 and the BPF 22 for connecting the selected one of the BPF 21 and the BPF 22 with the ADC 13 so that a signal component outputted through the selected one of the BPF 21 and the BPF 22 is supplied to the ADC 13.

Each of the RFSWs 11 and 12 (filter selecting section) switches connection to the BPF 21 or the BPF 22 based on a filter selecting signal supplied from the CPU 15. The filter selecting signal is a signal for selecting one of the BPFs 21 and 22 which is to be connected to the ADC 13. The RFSWs 11 and 12 carry out, based on the filter selecting signal, switching operations synchronously so that the same one of the BPF 21 and the BPF 22 is to be connected.

Each of the BPFs 21 and 22 is a filter that allows a signal component having a particular frequency band among frequency bands distributed in the RF signal to pass through. As shown in FIG. 2, the BPFs 21 and 22 have respective pass bands PB1 and PB2 for allowing signal components having the respective frequency bands to pass through. In addition, each of the BPFs 21 and 22 functions as an anti-aliasing filter that removes a signal component having an unnecessary band in advance in order to avoid, in undersampling by the ADC 13, occurrence of aliasing of a signal having a frequency band other than a frequency band in which the undersampling is to be carried out.

The ADC 13 is a circuit for converting an analog signal component supplied from the RFSW 12 into digital data. The ADC 13 samples the RF signal in synchronization with a sampling clock CLKs. The ADC 13 does not carry out so-called baseband sampling which is sampling of a signal component that satisfies a sampling theorem in a first Nyquist zone (0 to $Fs*\frac{1}{2}$) shown in FIG. 2. The ADC 13 carries out so-called undersampling which is sampling of a signal component that does not satisfy sampling theorems in a second Nyquist zone ($Fs*\frac{1}{2}$ to Fs) and subsequent Nyquist zones shown in FIG. 2.

Figure 2:
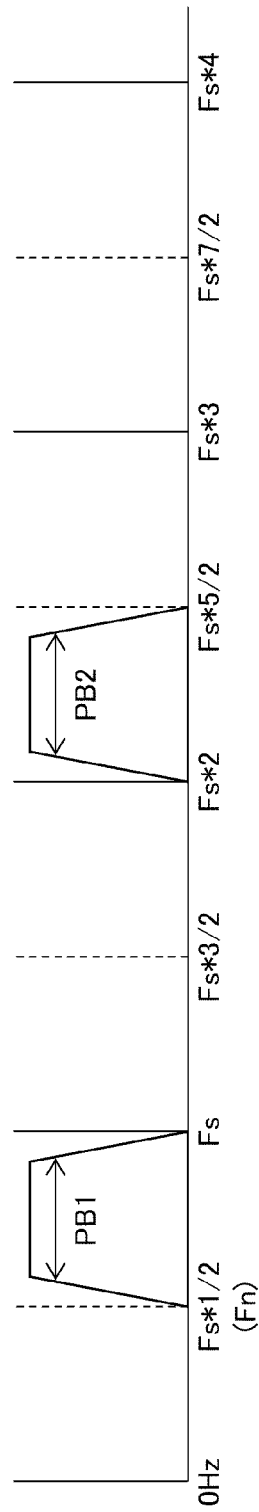
FIG. 2 is a view showing Nyquist zones of an AD converter in the wireless communication device.

As shown in FIG. 2, a sampling frequency Fs of the ADC 13 is set so that frequencies ($F*\frac{1}{2}$, Fs, $Fs*3/2$, $Fs*2$, $Fs*5/2$, $Fs*3$, $Fs*7/2$, $Fs*4$, ... ) which are integral multiples (positive integral multiples) of a Nyquist frequency Fn ($=Fs*\frac{1}{2}$) based on the sampling frequency Fs do not fall within frequency bands of signal components which are to pass through the BPFs 21 and 22.

The signal processing section 14 carries out predetermined processing with respect to the converted digital signal component (digital signal) outputted from the ADC 13. Examples of the predetermined processing carried out by the signal processing section 14 include mixing, filtering, detection, and the like. The signal processing section 14 carries out the predetermined process based on the filter selecting signal supplied from the CPU 15. From this, the signal processing section 14 can carry out processing according to a signal component that has passed through any of the BPFs 21 and 22.

The signal processing section 14 can be configured by a digital signal processor (DSP), a field programmable gate array (FPGA), or the like that can digitally carry out signal processing. The FPGA can carry out a high speed arithmetic operation by parallel processing. From this, the FPGA can carry out signal processing in a shorter time as compared with the DSP that carries out serial processing, and is therefore suitable for processing of an RF signal that necessitates a huge amount of arithmetical operations.

The CPU 15 supplies the above described filter selecting signal to the RFSWs 11 and 12 and the signal processing section 14 so that any one of the BPFs 21 and 22 is selected in accordance with the band selecting signal supplied from the operation section 16. The band selecting signal is a signal for selecting a particular frequency band in the RF signal.

The operation section 16 provides an operation instruction to the CPU 15 based on various operations by a user. The operation section 16 outputs the band selecting signal based on an operation to select a band.

In the wireless communication device 101, the RFSWs 11 and 12, the ADC 13, the CPU 15, and the BPFs 21 and 22 constitute the AD converting device.

Next, operation of the wireless communication device 101 configured as described above will be described.

In a case where a filter selecting signal supplied from the CPU 15 is a signal to select the BPF 21, the RFSW 11 connects the antenna 10 to the BPF 21, and the RFSW 12 connects the BPF 21 to the ADC 13. The BPF 21 has a pass band PB1 and allows a signal component having a predetermined frequency band in the RF signal received by the antenna 10 to pass through.

In a case where a filter selecting signal supplied from the CPU 15 is a signal to select the BPF 22, the RFSW 11 connects the antenna 10 to the BPF 22, and the RFSW 12 connects the BPF 22 to the ADC 13. The BPF 22 has a pass band PB2 and allows a signal component having a predetermined frequency band in the RF signal received by the antenna 10 to pass through.

The ADC 13 carries out, based on the sampling clock CLKs, undersampling with respect to a signal component supplied from the RFSW 12, and converts the sampled signal component into digital data by quantization and encoding.

The signal processing section 14 carries out predetermined processing with respect to digital data outputted from the ADC 13, and outputs a demodulated signal OUT from which an aliasing noise has been removed.

The demodulated signal OUT is converted into an analog signal by an external DA converter, and is then amplified by an amplifier and supplied to a speaker or the like.

As described above, the wireless communication device 101 in accordance with Embodiment 1 includes (i) the BPFs 21 and 22 for allowing respective signal components having different and non-overlapping frequency bands in the RF signal to pass through, (ii) the ADC 13 for carrying out undersampling with respect to the signal component, and (iii) the RFSWs 11 and 12 for selecting one of the BPFs 21 and 22 which is to be connected to the ADC 13.

Thus, the ADC 13 can be configured by a circuit of low sampling rate. Moreover, the signal component which has passed through any one of the BPFs 21 and 22 is sampled by the ADC 13. Therefore, the RF signal can be sampled efficiently.

Furthermore, the sampling frequency of the ADC 13 is set so that frequencies which are integral multiples of a Nyquist frequency based on the sampling frequency fall within frequency bands in which signal components of the RF signal are not included.

This makes it possible to provide the signal components in respective Nyquist zones while avoiding frequencies around integral multiples of the Nyquist frequency (i.e., approximately 0% to 10% and 90% to 100% of the integral multiples of the Nyquist frequency) in which signal regeneration is difficult due to aliasing. Therefore, the wireless communication device 101 is suitable for use as a wireless communication device (such as an amateur radio device, a professional radio device (using bands above and below VHF), a TV tuner (ground wave, BS, CS)) that receives an RF signal in which frequency bands of respective signal components are distributed.

For example, the following frequency bands are available in an amateur radio device. In a case where the wireless communication device 101 is applied to an amateur radio device capable of receiving radio waves having frequency bands indicated below, three BPFs (BPFs 21 and 22 and additionally BPF 23) are provided for allowing respective signal components having the frequency bands below to pass through, and the RFSWs 11 and 12 are configured to switch between the three bandpass filters so that one of the three BPFs is connected to the antenna 10 and the ADC 13.

(1) 144 MHz band: 144 MHz to 146 MHz
(2) 430 MHz band: 430 MHz to 440 MHz
(3) 1200 MHz band: 1260 MHz to 1300 MHz According to the wireless communication device 101, the sampling frequency Fs is set to, for example, 200 MHz. Moreover, the 144 MHz band, the 430 MHz band, and the 1200 MHz band are allocated to a second Nyquist zone, to a fifth Nyquist zone, and to a 13th Nyquist zone, respectively. The sampling frequency Fs and the allocation of the frequency bands in the respective Nyquist zones are merely an example, and are not limited to this example.

The CPU 15 (notifying section) supplies a filter selecting signal to the signal processing section 14, and thus notifies the signal processing section 14 of one of the BPFs 21 and 22 which is being selected by the RFSWs 11 and 12.

This allows the signal processing section 14 to correctly recognize a frequency band of a signal component which is to be subjected to the signal processing in the input signal.

Note that the number of bandpass filters in Embodiment 1 is not limited to the above described two and three, and can be four or more. One of the plurality of bandpass filters can be replaced with a lowpass filter. By using the lowpass filter, a signal having a frequency not higher than the Nyquist frequency can be sampled normally. The same applies to Embodiment 2 described below.

Embodiment 2

Figure 3:
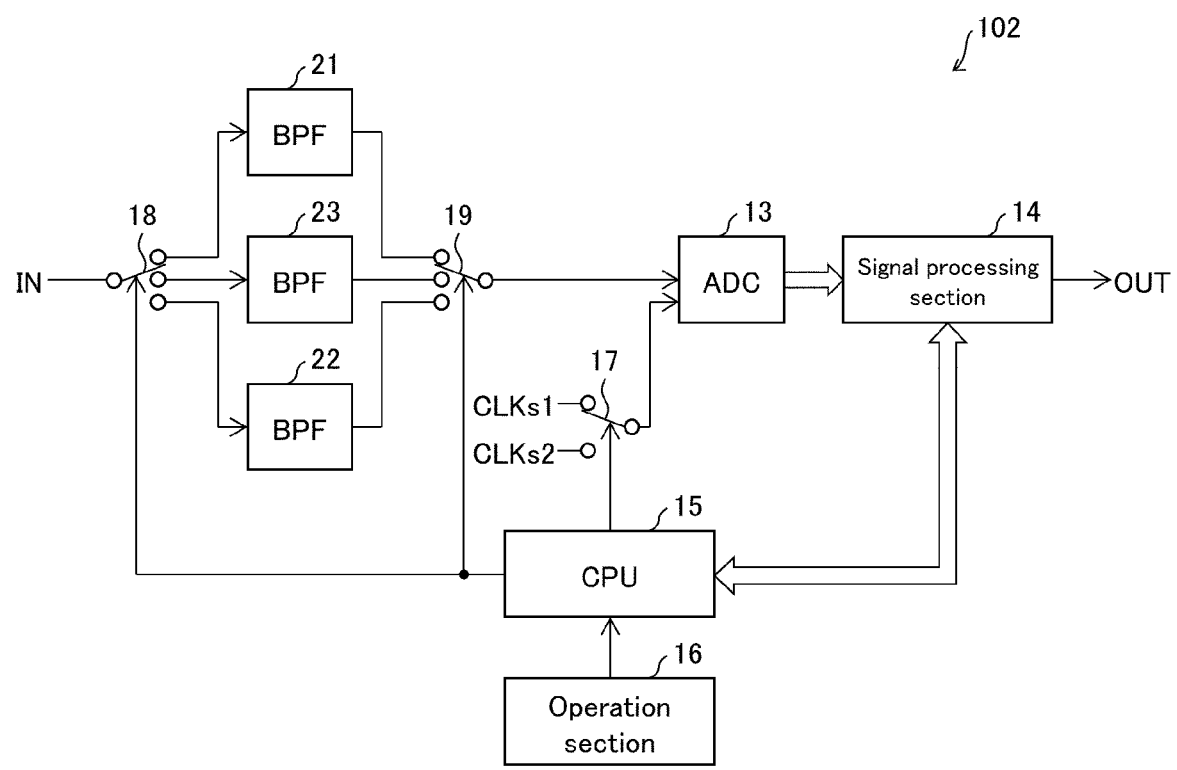
FIG. 3 is a block diagram illustrating a configuration of a wireless communication device in accordance with Embodiment 2 of the present invention.

The following description will discuss Embodiment 2 of the present invention with reference to FIGS. 3 and 4. In Embodiment 2, constituent elements having the same functions as those in Embodiment 1 are denoted by the same reference numerals, and descriptions of such constituent elements are omitted.

FIG. 3 is a block diagram illustrating a configuration of an electronic apparatus 102 in accordance with Embodiment 2. Each of FIG. 4A and FIG. 4B is a view showing Nyquist zones of the ADC 13 in the electronic apparatus 102.

As illustrated in FIG. 3, as with the wireless communication device 101, the electronic apparatus 102 includes an ADC 13, a signal processing section 14, a CPU 15, an operation section 16, and BPFs 21 and 22. The electronic apparatus 102 further includes switches 18 and 19 (filter selecting section), a bandpass filter (indicated by BPF in FIG. 3) 23, and a clock switch 17. In the following description, the bandpass filter 23 is referred to as "BPF 23". The electronic apparatus 102 is a device such as a wireless communication device, a measuring instrument, or an optical distance measuring device that carries out a process by converting an analogue high frequency input signal IN (input signal) into a digital signal.

The BPF 23 is a filter that allows a signal component having a particular frequency band in the high frequency input signal IN to pass through. The BPF 23 has a pass band PB3 that does not overlap with the pass bands BP1 and BP2 of the respective BPFs 21 and 22, as shown in FIG. 4A. Thus, the frequency bands of signal components to pass through the respective BPFs 21 through 23 are distributed. Note, however, that, in order to sample a signal having consecutive frequency bands, not all of the frequency bands are distributed but at least two frequency bands overlap with each other.

The switch 18 is a switch for switching between the BPFs 21 through 23 so that the high frequency input signal IN is inputted to a selected one of the BPFs 21 through 23. The switch 19 is a switch that switches between the BPFs 21 through 23 for connecting the selected one of the BPFs 21 through 23 with the ADC 13 so that a signal component outputted through the selected one of the BPFs 21 through 23 is supplied to the ADC 13. The switches 18 and 19 switch connection to any one of the BPFs 21 through 23 based on the above described filter selecting signal supplied from the CPU 15. The switches 18 and 19 carry out, based on the filter selecting signal, switching operations synchronously so that the same one of the BPFs 21 through 23 is to be connected.

The clock switch 17 is a switch that switches between a first sampling clock CLKs1 and a second sampling clock CLKs2 having different frequencies and supplies the selected one to the ADC 13. The clock switch 17 switches, based on a clock switching signal supplied from the CPU 15, between the first sampling clock CLKs1 and the second sampling clock CLKs2 so that the selected one is to be supplied to the ADC 13. A frequency of the second sampling clock CLKs2 is higher than a frequency of the first sampling clock CLKs1.

In Embodiment 2, the CPU 15 further outputs the clock switching signal.

In Embodiment 2, a first sampling frequency Fs1 of the ADC 13 is based on the first sampling clock CLKs1 (which is identical with the sampling clock CLKs of Embodiment 1). As shown in FIG. 4A, the first sampling frequency Fs1 of the ADC 13 is set so that frequencies (Fs1*½, Fs1, Fs1*3/2, Fs1*2, Fs1*5/2, Fs1*3, Fs1*7/2, Fs1*4, . . . ) which are integral multiples of a first Nyquist frequency Fn1 (=Fs1*½) based on the first sampling frequency Fs1 (which can be an arbitrary sampling frequency if three or more sampling frequencies exist) do not fall within frequency bands of signal components which are of the high frequency input signal IN and are to pass through the BPFs 21 and 22 and are supplied to the ADC 13.

As shown in FIG. 4B, the second sampling frequency Fs2 (which can be another arbitrary sampling frequency if three or more sampling frequencies exist) of the ADC 13 is set so that frequencies (Fs2*½, Fs2, Fs2*3/2, Fs2*2, Fs2*5/2, Fs2*3, . . . ) which are integral multiples of a second Nyquist frequency Fn2 (=Fs2*½) based on the second sampling frequency Fs2 do not fall within a frequency band of a signal component which is of the high frequency input signal IN, is to pass through the BPF 23, and is supplied to the ADC 13. As shown in FIG. 4A and FIG. 4B, the second sampling frequency Fs2 is set so that, within a range of frequency bands used by the electronic apparatus 102, frequencies which are integral multiples of the first Nyquist frequency Fn1 differ from frequencies which are integral multiples of the second Nyquist frequency Fn2.

Next, operation of the electronic apparatus 102 configured as described above will be described.

In a case where a filter selecting signal supplied from the CPU 15 is a signal to select the BPF 21 or the filter selecting signal is a signal to select the BPF 22, the electronic apparatus 102 operate in a manner similar to that of the wireless communication device 101 in accordance with Embodiment 1. Note, however, that, in those cases, the clock switch 17 in the electronic apparatus 102 allows the first sampling clock CLKs1 to be supplied to the ADC 13 based on a clock selecting signal supplied from the CPU 15.

In a case where the filter selecting signal is a signal to select the BPF 23, the switch 18 allows a high frequency input signal IN to be supplied to the BPF 23, and the switch 19 connects the BPF 23 with the ADC 13. The BPF 23 allows a signal component having a predetermined frequency band in the high frequency input signal IN to pass through. The clock switch 17 allows the second sampling clock CLKs2 to be supplied to the ADC 13 based on a clock selecting signal supplied from the CPU 15.

The ADC 13 carries out, based on the second sampling clock CLKs2, undersampling with respect to a signal component supplied from the switch 19, and converts the sampled signal component into digital data by quantization and encoding.

The signal processing section 14 carries out predetermined processing with respect to digital data outputted from the ADC 13, and outputs a demodulated signal OUT. The demodulated signal OUT is converted into an analog signal, and is then amplified and supplied to a speaker or the like.

As described above, the electronic apparatus 102 in accordance with Embodiment 2 includes (i) the BPFs 21 through 23 for allowing respective signal components having different and non-overlapping frequency bands in the high frequency input signal IN to pass through, (ii) the ADC 13 for carrying out undersampling with respect to the signal component, and (iii) the switches 18 and 19 for selecting one of the BPFs 21 through 23 which is to be connected to the ADC 13.

Thus, the ADC 13 can be configured by a circuit of low sampling rate. Moreover, the signal component which has passed through any one of the BPFs 21 through 23 is sampled by the ADC 13. Therefore, the high frequency input signal IN can be sampled efficiently.

Furthermore, the first sampling frequency Fs1 is set so that frequencies which are integral multiples of a first Nyquist frequency Fn1 based on the first sampling frequency Fs1 fall within frequency bands in which signal components of the high frequency input signal IN which are to be supplied to the ADC 13 are not included. Moreover, the second sampling frequency Fs2 is set so that (i) frequencies which are integral multiples of the second Nyquist frequency Fn2 based on the second sampling frequency Fs2 fall within frequency bands in which signal components of the high frequency input signal IN which are to be supplied to the ADC 13 are not included and (ii) the frequencies which are integral multiples of the first Nyquist frequency Fn1 differ from the frequencies which are integral multiples of the second Nyquist frequency Fn2.

According to the configuration, in a case where the ADC 13 carries out sampling at the second sampling frequency Fs2, signal components are sampled which are in the frequency bands having the frequencies which are integral multiples of the first Nyquist frequency Fn1. Therefore, it is possible to sample the signal components which cannot be sampled at the first sampling frequency Fs1. By thus carrying out sampling by switching between the first sampling frequency Fs1 and the second sampling frequency Fs2, it is possible to sample signal components while mutually interpolating frequency bands in the input signal.

In addition, a third sampling frequency Fs3, a fourth sampling frequency Fs4, and the like can be provided to supplement integral multiples of the first sampling frequency Fs1 and the second sampling frequency Fs2.

[Example of Configuration Achieved by Software]

The switching control functions of the wireless communication device 101 and the electronic apparatus 102 can be realized by a logic circuit (hardware) provided in an integrated circuit (IC chip) or the like. Alternatively, the switching control functions can be realized by software.

In the latter case, the wireless communication device 101 and the electronic apparatus 102 include a computer that executes instructions of a program that is software realizing the switching control functions. The computer includes, for example, the CPU 15 as at least one processor and a computer-readable storage medium storing the program. In a case where the processor in the computer reads out the program from the storage medium and executes the program, the object of the present invention is achieved.

The storage medium can be a "non-transitory tangible medium" such as, for example, a tape, a disk, a card, a semiconductor memory, a programmable logic circuit, or the like, as well as a read only memory (ROM) or the like. The computer can further include a random access memory (RAM) in which the program is loaded. The program can be supplied to or made available to the computer via any transmission medium (such as a communication network or a broadcast wave) that can transmit the program. Note that an aspect of the present invention can also be achieved in the form of a computer data signal in which the program is embodied via electronic transmission and which is embedded in a carrier wave.

Aspects of the present invention can also be expressed as follows:

The AD converting device in accordance with an aspect of the present invention includes: a plurality of bandpass filters that respectively allow signal components of an analog input signal to pass through, the signal components having distributed frequency bands; an AD converter that converts a signal component which is one of the signal components and has been supplied through any one of the plurality of bandpass filters into digital data by undersampling; and a filter selecting section that selects, from among the plurality of bandpass filters, one bandpass filter to be connected to the AD converter, a sampling frequency of the AD converter being set so that frequencies which are integral multiples of a Nyquist frequency based on the sampling frequency do not fall within the frequency bands of the signal components which are of the analog input signal and are to pass through the respective plurality of bandpass filters.

According to the configuration, undersampling is carried out, and it is therefore possible to use an AD converter of low sampling rate. Moreover, the signal component having the frequency band which has passed through any one of the plurality of bandpass filters is sampled by the AD converter. From this, an input signal can be sampled inexpensively and efficiently.

In the AD converting device, it is possible that the AD converter operates at a plurality of sampling frequencies which are different from each other; a first sampling frequency which is an arbitrary one of the plurality of sampling frequencies is set so that frequencies which are integral multiples of a first Nyquist frequency based on the first sampling frequency do not fall within the frequency bands of the signal components which are of the analog input signal and are to be supplied to the AD converter through the respective plurality of bandpass filters; and a second sampling frequency which is another arbitrary one of the plurality of sampling frequencies is set so that (i) frequencies which are integral multiples of a second Nyquist frequency based on the second sampling frequency do not fall within the frequency bands of the signal components which are of the analog input signal and are to be supplied to the AD converter through the respective plurality of bandpass filters and (ii) the frequencies which are the integral multiples of the first Nyquist frequency differ from the frequencies which are the integral multiples of the second Nyquist frequency.

According to the configuration, in a case where the AD converter carries out sampling at the second sampling frequency, signal components are sampled which are in the frequency bands having the frequencies which are integral multiples of the first Nyquist frequency. Therefore, the signal components which cannot be sampled at the first sampling frequency are sampled. By thus carrying out sampling at the first sampling frequency or the second sampling frequency, it is possible to sample signal components while mutually interpolating frequency bands in the input signal.

In the AD converting device, any one of the plurality of bandpass filters is replaced with a lowpass filter.

By using the lowpass filter as in the above configuration, a signal having a frequency not higher than the Nyquist frequency can be sampled normally.

The electronic apparatus in accordance with an aspect of the present invention includes: any of the AD converting devices described above; and a signal processing section that carries out predetermined processing with respect to a digital signal that has been outputted from the AD converter.

According to the configuration, it is possible to provide the electronic apparatus that can efficiently carry out sampling of an input signal.

The electronic apparatus can further include a notifying section that notifies the signal processing section of a bandpass filter which is being selected by the filter selecting section from among the plurality of bandpass filters.

According to the configuration, the signal processing section can correctly recognize a frequency band of a signal component which is to be subjected to the signal processing in the input signal, even in a case where aliasing is included in the signal component that has been converted into digital data by undersampling.

ADDITIONAL REMARKS

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST

11, 12: High frequency switch (AD converting device, filter selecting section)
13: AD converter (AD converting device)
14: Signal processing section
15: CPU (AD converting device, notifying section)
18, 19: Switch (AD converting device, filter selecting section)
21 through 23: Bandpass filter (AD converting device)
101: Wireless communication device (electronic apparatus)
102: Electronic apparatus
Fn: Nyquist frequency
Fn1: First Nyquist frequency
Fn2: Second Nyquist frequency
Fs: Sampling frequency
Fs1: First sampling frequency
Fs2: Second sampling frequency

The invention claimed is:
1. An AD converting device comprising:
a plurality of bandpass filters that respectively allow signal components of an analog input signal to pass through, the signal components having distributed frequency bands;
an AD converter that converts a signal component which is one of the signal components and has been supplied through any one of the plurality of bandpass filters into digital data by undersampling; and
a filter selecting section that selects, from among the plurality of bandpass filters, one bandpass filter to be connected to the AD converter,
wherein:
a sampling frequency of the AD converter is set so that frequencies which are integral multiples of a Nyquist frequency based on the sampling frequency do not fall within the frequency bands of the signal components which are of the analog input signal and are to pass through the respective plurality of bandpass filters,
the AD converter operates at a plurality of sampling frequencies which are different from each other,
a first sampling frequency which is an arbitrary one of the plurality of sampling frequencies is set so that frequencies which are integral multiples of a first Nyquist frequency based on the first sampling frequency do not fall within the frequency bands of the signal components which are of the analog input signal and are to be supplied to the AD converter through the respective plurality of bandpass filters, and
a second sampling frequency which is another arbitrary one of the plurality of sampling frequencies is set so that (i) frequencies which are integral multiples of a second Nyquist frequency based on the second sampling frequency do not fall within the frequency bands of the signal components which are of the analog input signal and are to be supplied to the AD converter through the respective plurality of bandpass filters and (ii) the frequencies which are the integral multiples of the first Nyquist frequency differ from the frequencies which are the integral multiples of the second Nyquist frequency.

2. The AD converting device according to claim 1, wherein any one of the plurality of bandpass filters is replaced with a lowpass filter.

3. An electronic apparatus comprising:
an AD converting device according to claim 1; and
a signal processing section that carries out predetermined processing with respect to a digital signal that has been outputted from the AD converter.

4. The electronic apparatus according to claim 3, further comprising a notifying section that notifies the signal processing section of a bandpass filter which is being selected by the filter selecting section from among the plurality of bandpass filters.

5. An electronic apparatus comprising:
an AD converting device comprising:
a plurality of bandpass filters that respectively allow signal components of an analog input signal to pass through, the signal components having distributed frequency bands;
an AD converter that converts a signal component which is one of the signal components and has been supplied through any one of the plurality of bandpass filters into digital data by undersampling;
a filter selecting section that selects, from among the plurality of bandpass filters, one bandpass filter to be connected to the AD converter; and
a notifying section that notifies the signal processing section of a bandpass filter which is being selected by the filter selecting section from among the plurality of bandpass filters; and
a signal processing section that carries out predetermined processing with respect to a digital signal that has been outputted from the AD converter,
a sampling frequency of the AD converter being set so that frequencies which are integral multiples of a Nyquist frequency based on the sampling frequency do not fall within the frequency bands of the signal components which are of the analog input signal and are to pass through the respective plurality of bandpass filters.

\* \* \* \* \*